US012588339B2

(12) United States Patent
Lee et al.

(10) Patent No.: US 12,588,339 B2
(45) Date of Patent: Mar. 24, 2026

(54) CUTTING AREA PATHWAY FOR DISPLAY MODULE

(71) Applicant: SAMSUNG ELECTRONICS CO., LTD., Suwon-si (KR)

(72) Inventors: Donghun Lee, Suwon-si (KR); Sungyong Min, Suwon-si (KR); Youngki Jung, Suwon-si (KR); Bumki Baek, Suwon-si (KR); Changjoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 566 days.

(21) Appl. No.: 18/088,313

(22) Filed: Dec. 23, 2022

(65) Prior Publication Data

US 2023/0125557 A1      Apr. 27, 2023

Related U.S. Application Data

(63) Continuation of application No. PCT/KR2021/005553, filed on May 3, 2021.

(30) Foreign Application Priority Data

Jul. 29, 2020      (KR) ........................ 10-2020-0094751

(51) Int. Cl.
H01L 27/15 (2006.01)
H01L 25/075 (2006.01)
(Continued)

(52) U.S. Cl.
CPC ....... H10H 20/857 (2025.01); H01L 25/0753 (2013.01); H10H 20/8312 (2025.01)

(58) Field of Classification Search
CPC .... H10K 71/861; H01L 25/167; H10D 86/40; H10D 86/441
See application file for complete search history.

(56) References Cited

U.S. PATENT DOCUMENTS 8,791,474 B1      7/2014  Bibl et al.
9,048,320 B2      6/2015  Yamazaki et al.
(Continued)

FOREIGN PATENT DOCUMENTS

JP      2010-97024 A      4/2010
JP      2019-184938 A      10/2019
(Continued)

OTHER PUBLICATIONS

International Search Report dated Aug. 17, 2021, issued by the International Searching Authority in counterpart International Application No. PCT/KR2021/005553 (PCT/ISA/210).
(Continued)

*Primary Examiner* — Ismail A Muse
(74) *Attorney, Agent, or Firm* — Sughrue Mion, PLLC

(57) ABSTRACT

A display module includes a thin film transistor (TFT) substrate including a glass substrate, a TFT layer provided on the glass substrate, and a plurality of TFT electrodes provided on the TFT layer; and a plurality of light-emitting diodes (LEDs) electrically connected to the plurality of TFT electrodes, wherein the TFT layer includes a plurality of sacrificial switching elements connected to the plurality of LEDs in parallel and configured to absorb static electricity generated at the TFT layer.

10 Claims, 11 Drawing Sheets

(51) Int. Cl.

| | | |
|---|---|---|
| *H01L 29/26* | (2006.01) |
| *H01L 31/12* | (2006.01) |
| *H01L 33/00* | (2010.01) |
| *H10H 20/831* | (2025.01) |
| *H10H 20/857* | (2025.01) |

(56) References Cited

U.S. PATENT DOCUMENTS

| | | | | |
|---|---|---|---|---|
| 10,020,420 | B2 | 7/2018 | Zou et al. | |
| 10,043,788 | B1* | 8/2018 | Han | H10H 20/857 |
| 10,825,380 | B2 | 11/2020 | Kim et al. | |
| 10,854,639 | B2 | 12/2020 | Tominaga et al. | |
| 10,930,231 | B2 | 2/2021 | Kim et al. | |
| 11,238,818 | B2 | 2/2022 | Kim et al. | |
| 2010/0134461 | A1* | 6/2010 | Han | G09G 3/3233 |
| | | | | 345/82 |
| 2013/0043802 | A1* | 2/2013 | Han | G09G 3/3233 |
| | | | | 315/240 |
| 2014/0145164 | A1* | 5/2014 | Odaka | H10K 59/131 |
| | | | | 257/40 |
| 2016/0351092 | A1* | 12/2016 | Chen | H10H 20/857 |
| 2017/0012093 | A1* | 1/2017 | Ono | H10K 59/126 |
| 2017/0287399 | A1* | 10/2017 | Ahmed | G09G 3/3233 |
| 2017/0338211 | A1 | 11/2017 | Lin et al. | |
| 2018/0226388 | A1 | 8/2018 | Han | |
| 2019/0073963 | A1* | 3/2019 | Yang | G09G 3/3291 |
| 2019/0304386 | A1 | 10/2019 | Kim et al. | |
| 2019/0319046 | A1 | 10/2019 | Tominaga et al. | |
| 2019/0371231 | A1 | 12/2019 | Kim et al. | |
| 2021/0142748 | A1 | 5/2021 | Kim et al. | |

FOREIGN PATENT DOCUMENTS

| | | | |
|---|---|---|---|
| KR | 10-2012-0048033 | A | 5/2012 |
| KR | 10-2017-0049117 | A | 5/2017 |
| KR | 10-2017-0080745 | A | 7/2017 |
| KR | 10-2019-0080204 | A | 7/2019 |
| KR | 10-2019-0113535 | A | 10/2019 |
| KR | 10-2019-0136882 | A | 12/2019 |
| KR | 10-2093627 | B1 | 3/2020 |
| KR | 10-2020-0061841 | A | 6/2020 |

OTHER PUBLICATIONS

Written Opinion dated Aug. 17, 2021, issued by the International Searching Authority in counterpart International Application No. PCT/KR2021/005553 (PCT/ISA/237).

Communication issued Jan. 22, 2025 by the Korean Intellectual Property Office in Korean Patent Application No. 10-2020-0094751.

* cited by examiner

CUTTING AREA PATHWAY FOR DISPLAY MODULE

CROSS-REFERENCE TO RELATED APPLICATIONS

This application is a by-pass continuation of International Application No. PCT/KR2021/005553, filed on May 3, 2021, which is based on and claims priority to Korean Patent Application No. 10-2020-0094751, filed on Jul. 29, 2020, in the Korean Intellectual Property Office, the disclosures of which are incorporated herein by reference in their entireties.

BACKGROUND

1. Field

The disclosure relates to a display module, and more particularly, to a display module mounted with a plurality of micro light-emitting diodes (LEDs) on a thin film transistor (TFT) substrate.

2. Description of Related Art

Light-emitting diodes (LEDs) are widely used not only as a light source for lighting devices but also as light sources for displaying images of various display devices of various electronic products such as, for example, and without limitation, a television (TV), a mobile phone, a personal computer (PC), a notebook PC, a personal digital assistance (PDA), and the like. Recently, displays mounted with micro LEDs of less than or equal to 100 μm in size are being developed. Micro LEDs are receiving much attention as light-emitting elements of next generation displays for having a faster response rate, low power, and high brightness compared to LEDs of the related art.

As described above, the light-emitting element is transferred to a thin film transistor (TFT) layer formed on a glass substrate of a display. Electrodes (anode and cathode electrodes) of the light-emitting element are electrically connected to TFT electrodes (anode and cathode electrodes) formed on the TFT layer.

The TFT layer may be formed with an insulating film of a predetermined thickness to prevent introduction of static electricity to the surface and to physically protect the TFT layer. However, the TFT electrode is not covered by the insulating film and is opened because an electrode of the light-emitting element needs to be electrically connected.

Based on the above, during a process of manufacturing a display, for example, static electricity which is generated from around the display may be introduced inside the TFT layer through the TFT electrode may occur in various processes prior to the light-emitting element being transferred to the TFT layer. The static electricity introduced to the TFT layer may damage a pixel circuit formed in the TFT layer.

The light-emitting element corresponding to the pixel circuit damaged by static electricity may not show gray scale levels due to a dot error occurring. "Dot error" may refer to an error in which the light-emitting element is not controlled by the pixel circuit and is maintained at all times in an ON dot state or an OFF dot state.

Specifically, when the light-emitting element is maintained in the ON dot state, an effect on an image quality of the display may be greater than when the light-emitting element is maintained in the OFF dot state. That is, the light-emitting element which is maintained in the ON dot state may have a problem of being easily recognizable by the naked eye of a user even while an image is being played back in the display.

Because repairing the pixel circuit damaged by static electricity is not only technically very difficult, but also disadvantageous in terms of cost, the light-emitting element which is maintained in the ON dot state is forcibly cut so as to be in an inoperable state and continuously maintained in the OFF dot state. Based on the above, because the amount of time in OFF dot state which cannot be controlled from the display is increased, a problem of a quality of the display being deteriorated has not been fundamentally solved.

SUMMARY

Provided is a display module provided with sacrificial switching elements which may absorb static electricity at the thin film transistor (TFT) layer.

Additional aspects will be set forth in part in the description which follows and, in part, will be apparent from the description, or may be learned by practice of the presented embodiments.

According to an aspect of the disclosure, a display module includes: a thin film transistor (TFT) substrate including a glass substrate, a TFT layer provided on the glass substrate, and a plurality of TFT electrodes provided on the TFT layer; and a plurality of light-emitting diodes (LEDs) electrically connected to the plurality of TFT electrodes, wherein the TFT layer includes a plurality of sacrificial switching elements connected to the plurality of LEDs in parallel and configured to absorb static electricity generated at the TFT layer.

A sacrificial switching element of the plurality of sacrificial switching elements may include a first wiring electrically connected to an anode of a corresponding pixel circuit, and a second wiring electrically connected to a cathode of the corresponding pixel circuit, and the first wiring and the second wiring may be positioned at a cutting area configured to be exposed to a laser beam emitted from a laser emitter.

The cutting area may include: a first pathway extending from a front surface of the TFT substrate to the first wiring and the second wiring, and a second pathway extending from a rear surface of the TFT substrate to the first wiring and the second wiring.

The cutting area may have a transparency such that the laser beam passes through the cutting area.

The cutting area may include a pathway extending from a rear surface of the TFT substrate to the first wiring and the second wiring.

The cutting area may have a transparency such that the laser beam passes through the cutting area, and the TFT layer may further include a metal layer provided at a position corresponding to the cutting area.

The metal layer may be provided between a front surface of the TFT layer and the sacrificial switching element.

The cutting area may include a pathway extending from a front surface of the TFT substrate to the first wiring and the second wiring.

The cutting area may have a transparency such that the laser beam passes through the cutting area, and the glass substrate may further include a metal layer provided at a position which corresponds to the cutting area.

The metal layer may be provided at a rear surface of the glass substrate.

A distance between the sacrificial switching element and a TFT electrode of the plurality of TFT electrodes corresponding to the sacrificial switching element may be shorter than a distance between the corresponding pixel circuit and a TFT electrode of the plurality of TFT electrodes which controls an LED of the plurality of LEDs corresponding to the sacrificial switching element.

A pair of TFT electrodes to which an LED of the plurality of LEDs corresponding to the sacrificial switching element is connected may be provided between the sacrificial switching element and the corresponding pixel circuit.

The display module may further include a protection film including an insulating material, and a first portion of the pair of TFT electrodes adjacent to the LED corresponding to the sacrificial switching element is not covered by the protection film, and a second portion of the pair of TFT electrodes adjacent to the sacrificial switching element is covered by the protection film.

The second portion of the pair of TFT electrodes may be an area at which an LED for repair is provided.

The plurality of sacrificial switching elements may be provided in the TFT layer.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
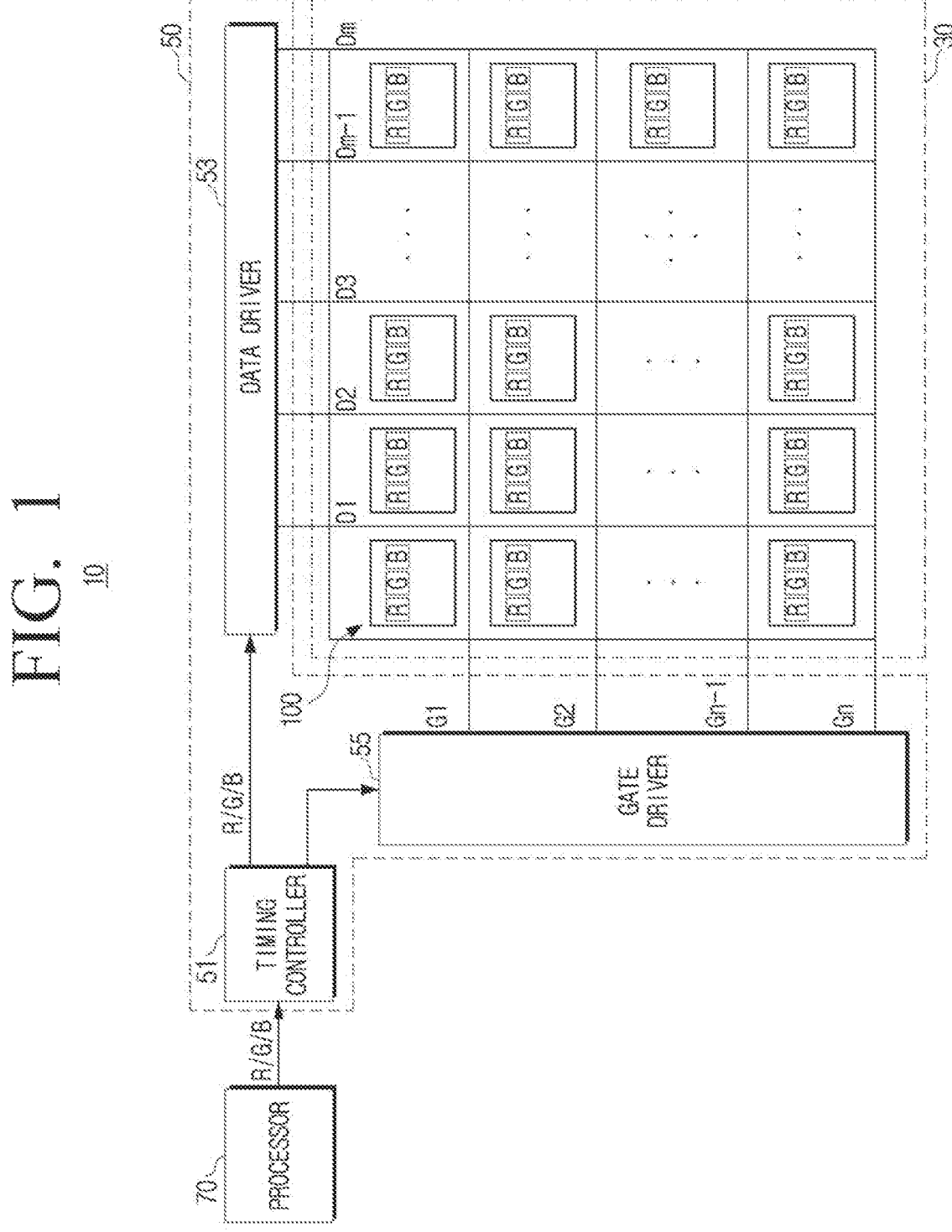
FIG. 1 is a diagram of a display module according to an embodiment of the disclosure.

Various embodiments will be described in greater detail below with reference to the accompanied drawings. Embodiments described herein may be variously modified. A specific embodiment may be illustrated in the drawings and described in detail in the detailed description. However, the specific embodiment described in the accompanied drawing is only to assist in the comprehension of the various embodiments. Accordingly, it should be noted that the disclosure is not limited by the specific embodiments described in the accompanied drawings, and should be interpreted to include all modifications, combinations, equivalents and/or alternatives of the embodiments included in the spirit of the disclosure and in the technical scope.

Terms including ordinal numbers such as first and second may be used in describing various elements, but the elements are not limited by the above-described terms. The above-described terms may be used only for the purpose of distinguishing one element from another element.

Expressions such as "have" or "include" are used herein to designate a presence of a characteristic, number, step, operation, element, component, or a combination thereof, and not to preclude a presence or a possibility of adding one or more of other characteristics, numbers, steps, operations, elements, components or a combination thereof.

In addition thereto, in describing the disclosure, in case it is determined that the detailed description of related known technologies or configurations may unnecessarily confuse the gist of the disclosure, the detailed description thereof will be omitted.

A glass substrate may be disposed with a TFT layer on which a thin film transistor (TFT) circuit is formed at a front surface thereof, and a driving circuit may be disposed at a back surface to drive the TFT circuit of the TFT layer. The glass substrate may be formed in a quadrangle shape. According to an embodiment, the glass substrate may be formed in a rectangle shape or a square shape.

A substrate on which the TFT layer is stacked to the glass substrate may be referred to as a TFT substrate. A structure by which the TFT layer is stacked to the glass substrate may be referred to as a backplane. The TFT substrate is not limited to a specific structure or type. For example, the TFT substrate referred in the disclosure may be implemented as an oxide TFT and a Si (poly silicon, a-silicon) TFT, an organic TFT, a graphene TFT, and the like, in addition to a low temperature polycrystalline silicon (LTPS) TFT, and may be applied by manufacturing only a P-type (or N-type) metal oxide semiconductor field effect transistor (MOSFET) in a Si wafer complementary metal oxide semiconductor (CMOS) process.

A front surface of the glass substrate on which the TFT layer is disposed may be divided into an active area and a dummy area. The active area may correspond to an area occupied by the TFT layer at the front surface of the glass substrate, and the dummy area may correspond to an edge area from the front surface of the glass substrate. The edge area may further include an edge of a rear surface of the glass substrate adjacent to a side surface of the glass substrate and a side surface of the glass substrate. In addition, the edge area may be a remaining area excluding an area at which the TFT circuit is disposed to the front surface of the glass substrate and an area at which a driving circuit disposed at the rear surface is disposed.

The glass substrate may be formed with a plurality of front surface connection pads which are electrically connected with the TFT circuit through wiring at the edge area of the front surface and a plurality of rear surface connection pads which are electrically connected with the driving circuit through wiring at the edge area of the rear surface. The plurality of front surface and rear surface connection pads may be disposed toward an inner side of the glass substrate by a certain distance from the side surface of the glass substrate. The front surface connection pads and the rear surface connection pads of the glass substrate may be electrically connected by side surface wiring which is formed at the edge area of the glass substrate.

At the TFT layer of the glass substrate, a plurality of pixels may be provided. One pixel may be formed of a plurality of sub pixels. One sub pixel may correspond to one micro LED. At the TFT layer, TFT circuits for driving each pixel may be included. The micro LED may be formed of an inorganic light-emitting material, and may be a semi-conductor chip capable of emitting light on its own when power is provided. In addition, the micro LED may be configured such that an anode electrode and a cathode electrode are formed at a same surface, and may have a flip chip structure formed such that a light-emitting surface is formed at an opposite side of the electrodes.

At the TFT layer formed on the glass substrate, a plurality of micro LEDs may be electrically connected. In an embodiment, the anode and cathode electrodes of the micro LED may be electrically connected to the TFT electrode on the TFT layer, and the electrode of the micro LED and the TFT electrode may have a bonding structure of a metal bonding state.

The display module with micro LEDs may be a flat display panel. The micro LEDs may be inorganic LEDs having a size of less than or equal to about 100 μm. The display module with the micro LEDs may provide better contrast, faster response time and higher energy efficiency than a liquid crystal display (LCD) panel which requires a backlight. Both an organic LED (OLED) and a micro LED which is an inorganic light-emitting diode have good energy efficiency, but the micro LED has higher brightness per watt, superior light-emitting efficiency, and longer life span than the OLED.

The display module may form a black matrix in-between the plurality of micro LEDs disposed on the TFT layer. The black matrix may enhance contrast ratio by blocking light which is emitted from a peripheral part of the micro LEDs adjacent to one another from being color-mixed, and prevent an increase in leakage current of the TFT by an external light source.

The display module may further include a touch screen panel which is disposed at the light-emitting surface side to which the plurality of micro LEDs emit light. In this case, a touch screen driver for driving the touch screen panel may be included.

The display module may further include a rear substrate which is disposed at the rear surface of the glass substrate and electrically connected through a flexible printed circuit (FPC), and the like, and the display module may further include a communication device configured to receive data.

The display module may be a flat display panel configured such that micro LEDs are mounted to the glass substrate and formed with side surface wiring. The display module as described above may be installed and applied, as a single unit, in a wearable device, a portable device, a handheld device, and an electronic product requiring various displays or applied in an electric field, and may be applied to a display device such as, for example, and without limitation, a monitor for a personal computer (PC), a high resolution TV and signage (or, digital signage), an electronic display, or the like through a plurality of assemblies as a matrix type.

The display module according to an embodiment of the disclosure will be described in detail below with reference to the drawings.

FIG. 1 is a diagram of a display module according to an embodiment of the disclosure.

Referring to FIG. 1, a display module 10 may include a TFT substrate 30, a panel driver 50, and a processor 70.

The TFT substrate 30 may include a glass substrate 31 and a TFT layer 33 formed at the front surface of the glass substrate 31. The TFT layer 33 may include a plurality of pixel areas 100. At each pixel area 100, a plurality of sub pixels and a pixel circuit for driving each sub pixel may be included in plurality. The plurality of sub pixels and the plurality of pixel circuits disposed at each pixel area 100 will be described in detail below.

The TFT substrate 30 may be formed such that gate lines G1 to Gn and data lines D1 to Dm are crossed. The pixel circuits may be formed at the area at which the gate lines G1 to Gn and data lines D1 to Dm are crossed.

The panel driver 50 may drive the TFT substrate 30 or each of the plurality of pixel circuits according to a control of the processor 70, and include a timing controller 51, a data driver 53, and a gate driver 55.

The timing controller 51 may receive input of an input signal, a horizontal synchronous signal, a vertical synchronous signal, a main clock signal, and the like from an outside, generate an image data signal, a scanning control signal, a data control signal, an emission control signal and the like, and provide to the TFT substrate 30, the data driver 53, the gate driver 55, and the like.

Specifically, the timing controller 51 may apply a control signal (MUX Sel R, G, B) for selecting one sub pixel from among R, G, and B sub pixels to the driving circuit.

The data driver 53 (or source driver) may generate data voltage (e.g., pulse width modulation (PWM) data voltage, pulse amplitude modulation (PAM) data voltage) by receiving image data and the like of R/G/B components from the processor 70 as means for generating a data signal.

In addition, the data driver 53 may apply the generated data signal to the TFT substrate 30.

The gate driver 55 may transfer the generated various control signals to a specific row (or, specific horizontal line) of the TFT substrate 30, or transfer to the whole line as means for generating various control signals such as, for example, and without limitation, control signal (SPWM(n)), control signal (SPAM), and the like.

In addition, the gate driver 55 may apply a driving voltage (VDD) to a driving voltage terminal of the driving circuit according to an embodiment.

The data driver 53 and the gate driver 55 may be disposed at the rear surface of the glass substrate 31 by being implemented as a whole or a part thereof on the TFT layer 33 or implemented as a separate semi-conductor integrated circuit (IC).

The processor 70 may control the overall operation of the display module 10. Specifically, the processor 70 may control the plurality of pixel circuits to perform the above-described operations by driving the TFT substrate 30 controlling the panel driver 50.

To this end, the processor 70 may be implemented as at least one from among a central processing unit (CPU), a micro-controller, an application processor (AP), a communication processor (CP), or an ARM processor.

According to an embodiment of the disclosure, the processor 70 may set a pulse width of a driving current according to the PWM data voltage, and control the panel driver 50 to set an amplitude of the driving current according to the PAM data voltage. At this time, the processor 70 may control, based on the TFT substrate 30 being formed on n-number of rows and m-number of columns, the panel driver 50 for the PWM data voltage to be applied in a row unit (horizontal line unit). In addition, the processor 70 may control the panel driver 50 for the PAM data voltage to be collectively applied to the whole sub pixels of the TFT layer 33.

The processor may simultaneously apply the driving voltage (VDD) to the plurality of pixel circuits included in the TFT layer 33, and display an image by controlling the panel driver 50 for a linear shift voltage (sweep voltage) to be applied to a PWM driving circuit of each of the plurality of pixel circuits.

Although the processor 70 and the timing controller 51 have been described as separate elements in FIG. 1, the timing controller 51 may perform, without the processor 70, a function of the processor 70 according to an embodiment.

Figure 2:
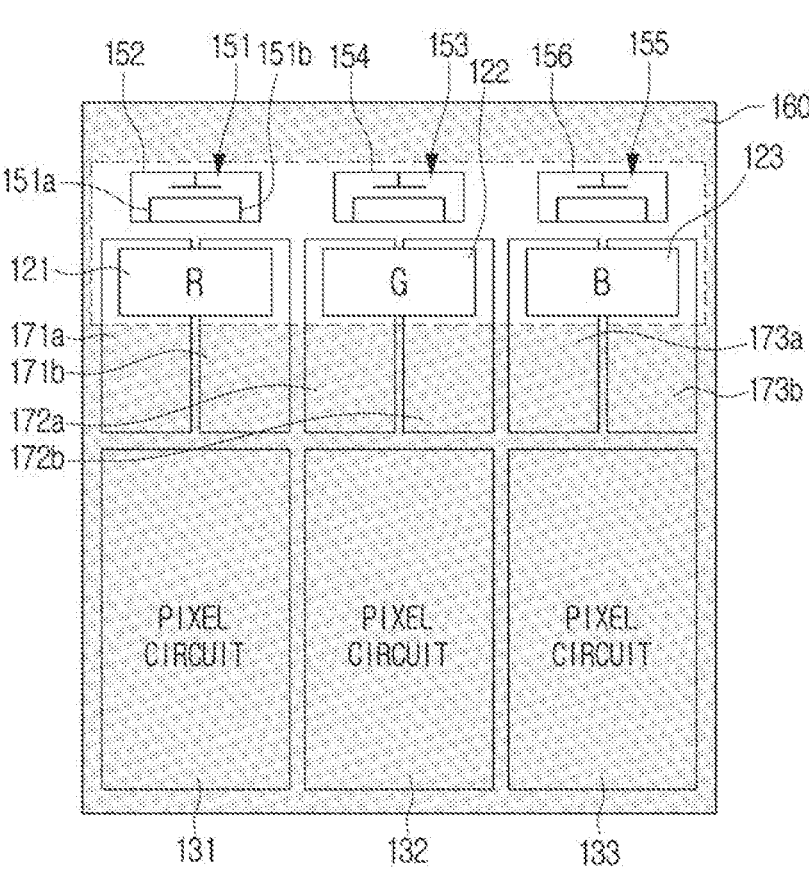
FIG. 2 is a diagram illustrating one from among a plurality of pixel areas formed at a thin film transistor (TFT) layer of a display module according to an embodiment of the disclosure.
Figure 3:
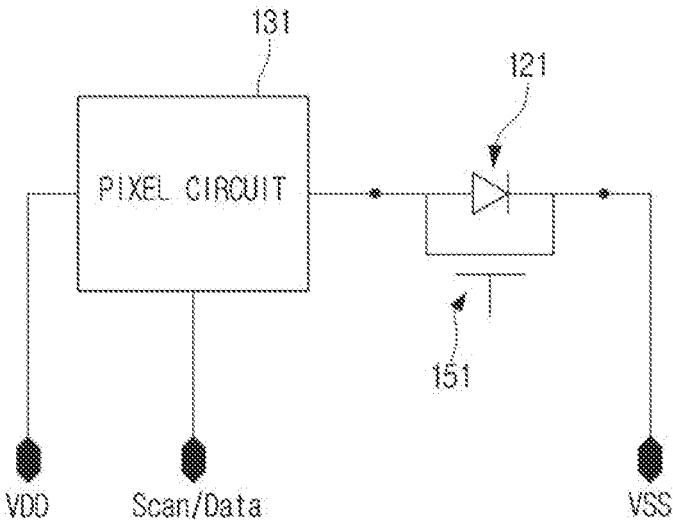
FIG. 3 is a diagram illustrating a sacrificial switching element connected to a sub pixel shown in FIG. 2 in parallel according to an embodiment of the disclosure.
Figure 4:
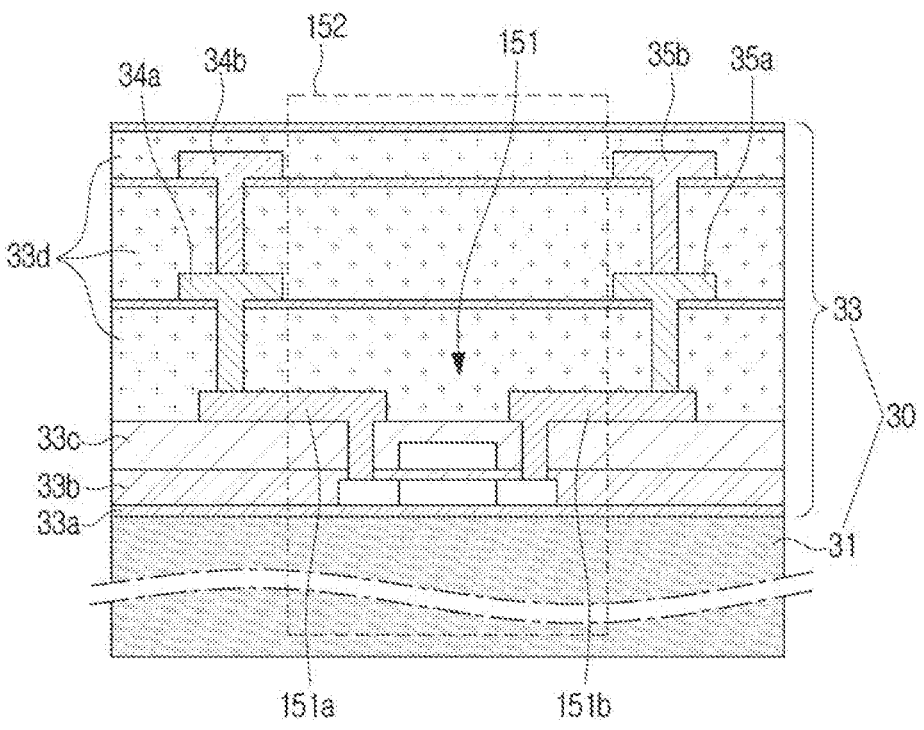
FIG. 4 is a diagram illustrating an example of a sacrificial switching element disposed in a TFT layer shown in FIG. 2 and wirings of the sacrificial switching element being disposed at a cutting area according to an example embodiment.

FIG. 2 is a diagram illustrating one from among a plurality of pixel areas formed at a thin film transistor (TFT) layer of a display module according to an embodiment of the disclosure. FIG. 3 is a diagram illustrating a sacrificial switching element connected to a sub pixel shown in FIG. 2 in parallel according to an embodiment of the disclosure. FIG. 4 is a diagram illustrating an example of a sacrificial switching element disposed in a TFT layer shown in FIG. 2 and wirings of the sacrificial switching element being disposed at a cutting area according to an example embodiment.

Referring to FIG. 2, at each pixel area 100 formed at the TFT layer 33, a plurality of sub pixels 121, 122, and 123, a plurality of pixel circuits 131, 132, and 133 for driving each of the sub pixels 121, 122, and 123, and a plurality of sacrificial switching elements 151, 153, and 155 respectively connected to the plurality of sub pixels 121, 122, and 123 in parallel may be disposed.

Referring to FIG. 4, the TFT layer 33 may be formed at the front surface of the glass substrate 31 and formed in a multi-layered structure. In an embodiment, the TFT layer 33 may include a buffer layer 33a, an insulation layer 33b, an insulation layer 33c between layers, and a plurality of passivation layers 33d. In addition, the TFT layer 33 may include metal wirings 34a, 34b, 35a, and 35b which are electrically connected to a voltage (VDD, VSS) terminal, and a sacrificial switching element 151. Wirings 151a and 151b of the sacrificial switching element may be electrically connected with each of the metal wirings 34a and 35b.

The plurality of sub pixels 121, 122, and 123 may form a single pixel. Each sub pixel may be a light-emitting element, for example, a self-emissive micro LED formed of an inorganic material. "Sub pixel' may refer to the same as "micro LED."

An example of the plurality of sub pixels which form one pixel being formed of three micro LEDs corresponding to a red, green, and blue color has been provided, but is not limited thereto. For example, the plurality of sub pixels which form one pixel may be formed with two micro LEDs of red and blue, red and green, or green and blue colors, or formed with three micro LEDs of red, blue, and white colors, or formed with four micro LEDs of red, green, blue, and white colors or red, green, green, and white colors. In this case, a number of pixel circuits may correspond to a number of sub pixels.

The plurality of sub pixels 121, 122, and 123 may respectively include an anode electrode and a cathode electrode. The anode electrode and the cathode electrode may be disposed at an opposite surface of the light-emitting surface of the micro LEDs.

Referring to FIG. 2, the anode electrode of each of the sub pixels 121, 122, and 123 may be respectively soldered to first TFT electrodes 171a, 172a, and 173a and connected to the driving voltage (VDD) terminal through the first TFT electrodes 171a, 172a, and 173a. In addition, a cathode electrode of each sub pixel 121 may be respectively soldered to second TFT electrodes 171b, 172b, and 173b and connected to a ground voltage (VSS) terminal through the second TFT electrodes 171b, 172b, and 173b.

The plurality of pixel circuits 131, 132, and 133 may be electrically connected with each of the sub pixels 121, 122, and 123 and control each of the sub pixels 121, 122, and 123 which correspond respectively thereto to drive light or flicker.

The plurality of sacrificial switching elements 151, 153, and 155 may be elements which do not participate in an operation of the respectively corresponding pixel circuits 131, 132, and 133, and may operate separately from the pixel circuits 131, 132, and 133.

Referring to FIG. 3 and FIG. 4, a sacrificial switching element 151 may be positioned in the TFT layer 33 and connected to the sub pixel 121 in parallel. The remaining sacrificial switching elements 153 and 155 not shown in FIG. 3 may also be connected to the sub pixels 122 and 123 corresponding respectively thereto in parallel.

Referring to FIG. 2, the first TFT electrodes 171a, 172a, and 173a and the second TFT electrodes 171b, 172b, and 173b may be disposed between the sacrificial switching elements 151, 153, and 155 and the pixel circuits 131, 132, and 133. The first TFT electrodes 171a, 172a, and 173a and the second TFT electrodes 171b, 172b, and 173b may be formed to a predetermined length so as to further provide a spare area at which LEDs for repair (not shown) may be mounted.

In order for the first TFT electrodes 171a, 172a, and 173a to be electrically connected respectively to the anode electrode of each of the sub pixels 121, 122, and 123 and the second TFT electrodes 171b, 172b, and 173b to be electrically connected respectively to the cathode electrode of each of the sub pixels 121, 122, and 123, the first TFT electrodes 171a, 172a, and 173a and the second TFT electrodes 171b, 172b, and 173b may configured such that at least a portion is exposed and not covered by a protection film 160. The protection film 160 may be an insulation film formed with an insulation material (organic material or inorganic material) formed stacked to the surface of the TFT layer by a predetermined thickness.

The first TFT electrodes 171a, 172a, and 173a and the second TFT electrodes 171b, 172b, and 173b may be configured such that a portion adjacent to the sacrificial switching elements 151, 153, and 155 is exposed and not covered by the protection film 160. At the exposed portion of the first TFT electrodes 171a, 172a, and 173a and the second TFT electrodes 171b, 172b, and 173b, a sub pixel may be mounted.

In addition, the first TFT electrodes 171a, 172a, and 173a and the second TFT electrodes 171b, 172b, and 173b may be configured such that another portion adjacent to the pixel circuits 131, 132, and 133 is covered by the protection film 160. The another portion of the first TFT electrodes 171a, 172a, and 173a and the second TFT electrodes 171b, 172b, and 173b covered by the protection film 160 may be an area for LEDs for repair. If the mounted micro LEDs are faulty, the protection film 160 may be removed and the micro LEDs for repair may be mounted at the first TFT electrodes 171a, 172a, and 173a and the second TFT electrodes 171b, 172b, and 173b for repair.

The static electricity generated from around the display module may flow inside the TFT layer 33 through one portion of the first TFT electrodes 171a, 172a, and 173a and the second TFT electrodes 171b, 172b, and 173b which is not covered by the protection film 160. In this case, the static electricity introduced in the TFT layer 33 may not flow to the pixel circuits 131, 132, and 133 and flow to each of the sacrificial switching elements 151, 153, and 155 disposed more adjacently to the first TFT electrodes 171a, 172a, and 173a and the second TFT electrodes 171b, 172b, and 173b than the pixel circuits 131, 132, and 133.

To this end, a distance between each of the sacrificial switching elements 151, 153, and 155 and the first TFT electrodes 171a, 172a, and 173a and the second TFT electrodes 171b, 172b, and 173b corresponding respectively thereto may be formed shorter than a distance between the pixel circuits 131, 132, and 133 and the first TFT electrodes 171a, 172a, and 173a and the second TFT electrodes 171b, 172b, and 173b corresponding respectively thereto.

The plurality of sacrificial switching elements 151, 153, and 155 may absorb, based on being respectively connected to the plurality of sub pixels 121, 122, and 123 in parallel, the static electricity which flows inside the TFT layer 33 through the first TFT electrodes 171a, 172a, and 173a and the second TFT electrodes 171b, 172b, and 173b. Accordingly, the plurality of pixel circuits 131, 132, and 133 may be prevented from being damaged by the static electricity introduced inside the TFT layer 33.

A dot error may occur at the sub pixel corresponding to the sacrificial switching element damaged by static electricity which is continuously maintained in the ON dot or the OFF dot state. In this case, if the sacrificial switching element connected to the sub pixel in parallel is physically separated, the sub pixel and the sacrificial switching element may be electrically separated. The sub pixel separated from the sacrificial switching element may be normally controlled by the corresponding pixel circuit.

As described above, the sub pixel corresponding to the sacrificial switching element which was damaged by static electricity may be physically and electrically separated from the damaged sacrificial switching element through laser cutting. The above will be described in detail below.

Referring to FIG. 2, a plurality of cutting areas 152, 154, and 156 may be provided to correspond to each of the sacrificial switching elements 151, 153, and 155. One cutting area 152 from among the plurality of cutting areas 152, 154, and 156 will be described below as an example.

A laser beam emitted from a laser emitter 200 (FIG. 5) may be emitted toward the front surface or the rear surface of the TFT substrate 30. The laser beam may pass through the inside of the TFT substrate 30 after being incident toward the front surface or the rear surface of the TFT substrate 30 and reach the wirings 151a and 151b of the sacrificial switching element.

The cutting area 152 may include a pathway which ranges from the front surface or the rear surface of the TFT substrate 30 until the wirings 151a and 151b of the sacrificial switching element.

The cutting area 152 may have a transparency degree through which a laser beam may pass. In addition, the cutting area 152 may have an opaque configuration which may block the laser beam, that is, a metal layer, metal wiring, or the like, to not be positioned at the cutting area 152.

For example, the cutting area 152 may have a transparency degree for the laser beam to reach from the front surface of the TFT substrate 30 to the wirings 151a and 151b of the switching elements. A portion of the TFT layer 33 formed at the front surface of the glass substrate 31 which corresponds to the cutting area 152 may have a transparency degree through which the laser beam may pass. An opaque structure (metal layer, metal wirings, etc.) which blocks the laser beam may not be disposed at the one portion of the TFT layer 33.

In addition, the cutting area 152 may have a transparency degree for the laser beam to reach from the rear surface of the glass substrate to the wirings 151a and 151b of the sacrificial switching element as shown in FIG. 4, and may not be disposed with an opaque configuration which blocks the laser beam.

Figure 5:
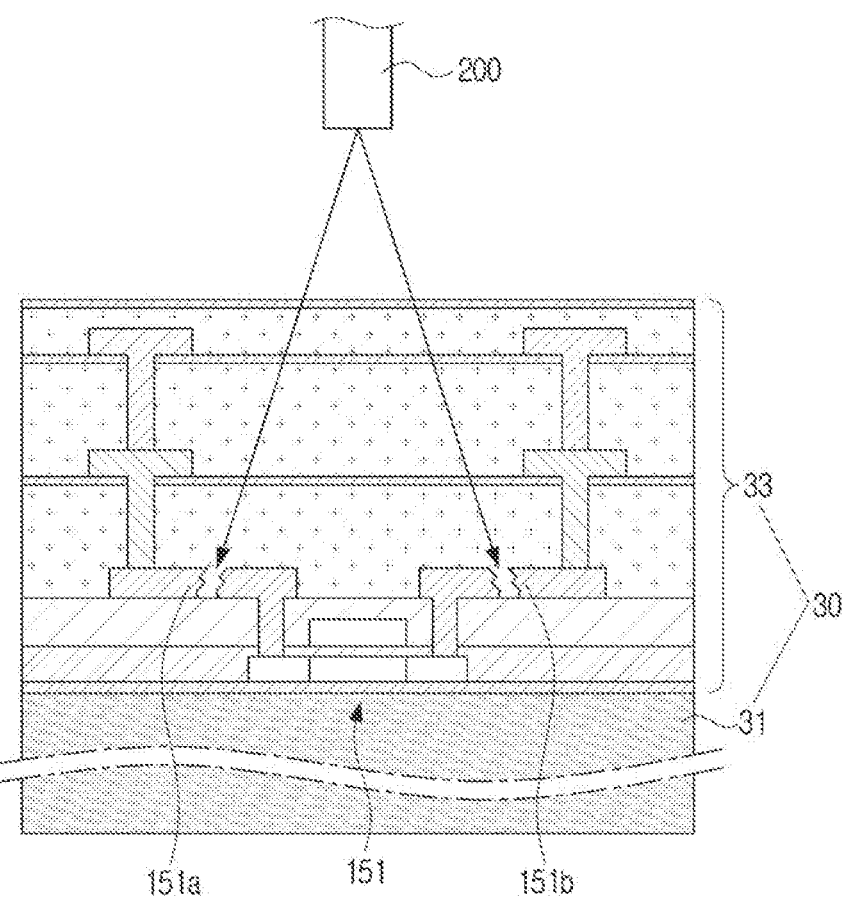
FIG. 5 is a diagram illustrating an example of laser cutting wirings of a sacrificial switching element which is positioned at a cutting area shown in FIG. 4 according to an example embodiment.

FIG. 5 is a diagram illustrating an example of laser cutting wirings of a sacrificial switching element which is positioned at a cutting area shown in FIG. 4 according to an example embodiment.

If the sacrificial switching element is damaged by static electricity introduced inside the TFT layer 33 though the TFT electrode prior to transferring the plurality of sub pixels on the TFT layer 33, the wirings of the sacrificial switching element connected to the sub pixel in parallel may be cut using the laser beam and the dot error of the sub pixel may be solved.

In an embodiment, the laser beam emitted from the laser emitter 200 may be emitted to the cutting area 152 toward the front surface of the TFT substrate 30 as shown in FIG. 5.

The laser beam may physically cut the wirings 151a and 151b of the switching element by passing through the TFT layer 33. In this case, a metal layer, metal wirings, or the like, which block the laser beam may not be positioned at the one portion of the TFT layer 33 which corresponds to the cutting area 152.

In addition, it may be possible for the display module 10 according to an embodiment of the disclosure to physically cut the wirings 151a and 151b of the switching element by irradiating the laser beam toward the rear surface of the TFT substrate 30.

In this case, the cutting area 152 may be configured such that a metal layer, metal wirings, or the like which block the laser beam on the glass substrate 31 and the pathway reaching from the front surface of the glass substrate 31 to the wirings 151a and 151b of the switching element are positioned such that the wirings 151a and 151b of the sacrificial switching element may be physically cut by the laser beam emitted to the cutting area 152 toward the rear surface of the TFT substrate 30.

Accordingly, the display module 10 according to an embodiment of the disclosure may be configured such that the wirings 151a and 151b of the sacrificial switching element are physically cut in both cases of when the laser beam is emitted toward the front surface of the TFT substrate 30 with respect to the cutting area 152 and when the laser beam is emitted toward the rear surface of the TFT substrate 30 with respect to the cutting area 152.

As described above, if the wirings 151a and 151b of the sacrificial switching element are physically cut by the laser beam, the electrical connection between the sacrificial switching element 151 and the sub pixel 121 may be cut. Accordingly, the sub pixel 121 may be converted to a state controllable by the pixel circuit 131 in a state in which the ON dot or OFF dot state is continuously maintained.

In the above, an example of a structure through which the laser beam cannot pass in the cutting area 152 has been described, but a structure which may block or interrupt the progress of the laser beam at the cutting area 152 may be positioned according to various conditions such as specifications or functions required in the display module. Embodiments of the display module for the case described above will be described below.

Figure 6:
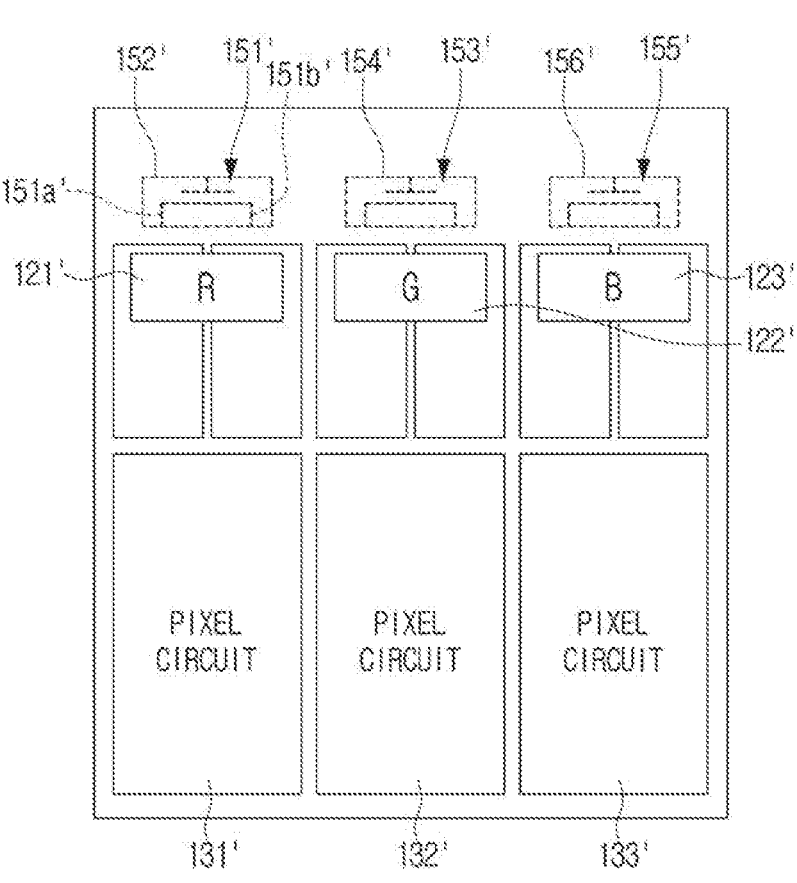
FIG. 6 is a diagram illustrating one from among a plurality of pixel areas formed at a TFT layer of a display module according to an embodiment of the disclosure.
Figure 7:
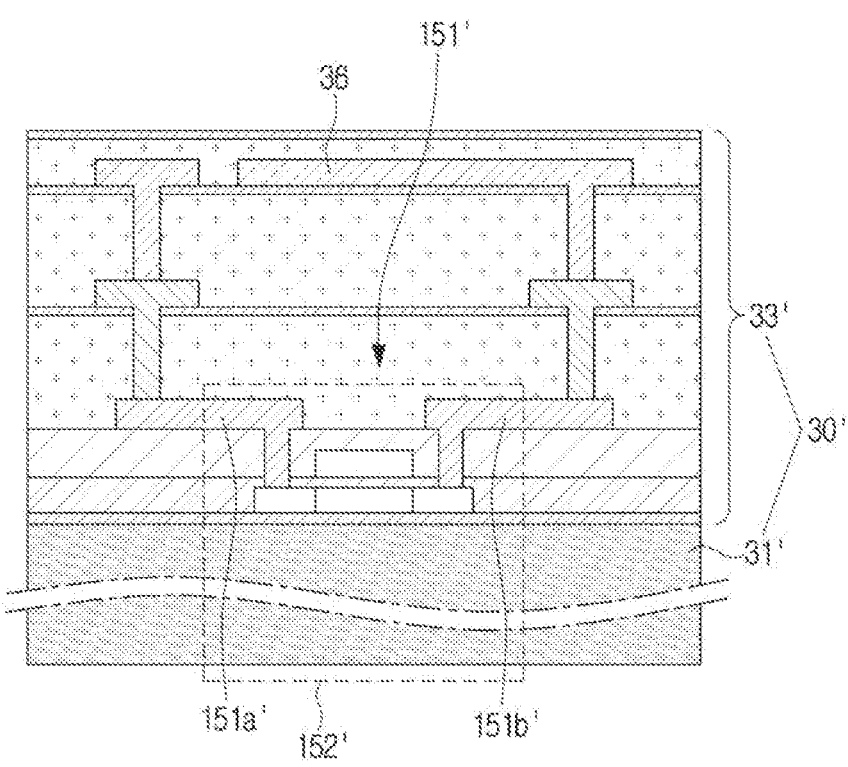
FIG. 7 is a diagram illustrating an example of a sacrificial switching element disposed in the TFT layer shown in FIG. 6 and wirings of the sacrificial switching element being disposed at a cutting area according to an example embodiment.
Figure 8:
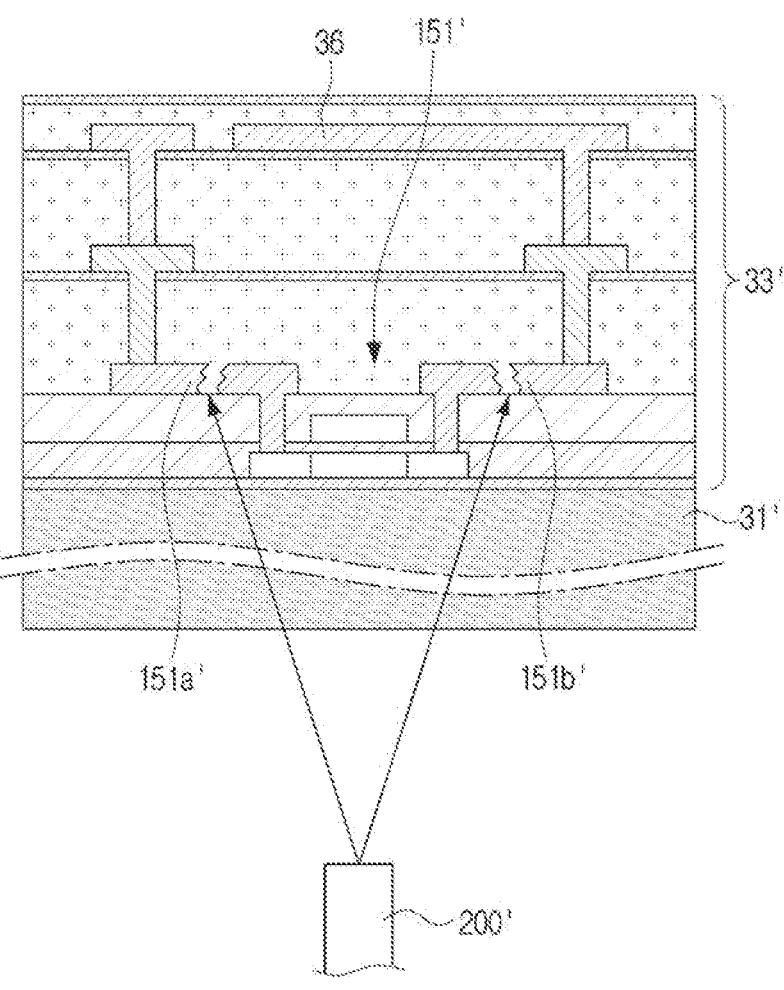
FIG. 8 is a diagram illustrating an example of laser cutting wirings of a sacrificial switching element which is positioned at the cutting area shown in FIG. 7 according to an example embodiment.

FIG. 6 is a diagram illustrating one from among a plurality of pixel areas formed at a TFT layer of a display module according to an embodiment of the disclosure. FIG. 7 is a diagram illustrating an example of a sacrificial switching element disposed in the TFT layer shown in FIG. 6 and wirings of the sacrificial switching element being disposed at a cutting area according to an example embodiment. FIG. 8 is a diagram illustrating an example of laser cutting wirings of a sacrificial switching element which is positioned at the cutting area shown in FIG. 7 according to an example embodiment.

Referring to FIG. 6 and FIG. 7, a metal layer 36 may be formed at a portion corresponding to a pixel area 100' based on a condition required by the display module. Specifically, the metal layer 36 may be formed at a predetermined position between a front surface of a TFT substrate 30' which corresponds to a cutting area 152' and a sacrificial switching element 151'. The metal layer 36 may be an opaque metal wiring for transferring power or a signal.

In this case, the cutting area 152' may be positioned only at a rear side of the TFT substrate 30'. That is, the cutting area 152' may include a pathway from a rear surface of a glass substrate 31' to wirings 151a' and 151b' of the sacrificial switching element 151'. Through the pathway, the laser beam may reach from the rear surface of the glass substrate 31' to the wirings 151a' and 151b' of the sacrificial switching element 151'.

Referring to FIG. 8, a laser beam may be emitted toward the rear surface of the TFT substrate 30' with respect to the cutting area 152' to cut the wirings 151a' and 151b' of a damaged sacrificial switching element. The laser beam emitted from a laser emitter 200' may reach the wirings 151a' and 151b' of the sacrificial switching element by sequentially passing one portion of the rear surface and a TFT layer 33' of the glass substrate 31' with respect to the cutting area 152'.

The wirings 151a' and 151b' of the sacrificial switching element may be electrically separated from a sub pixel 121' according to being physically cut by the laser beam.

In FIG. 6, 122' and 123' represent sub pixels, 131', 132', and 133' represent pixel circuits, 153' and 155' represent sacrificial switching elements, and 154' and 156' represent cutting areas.

Figure 9:
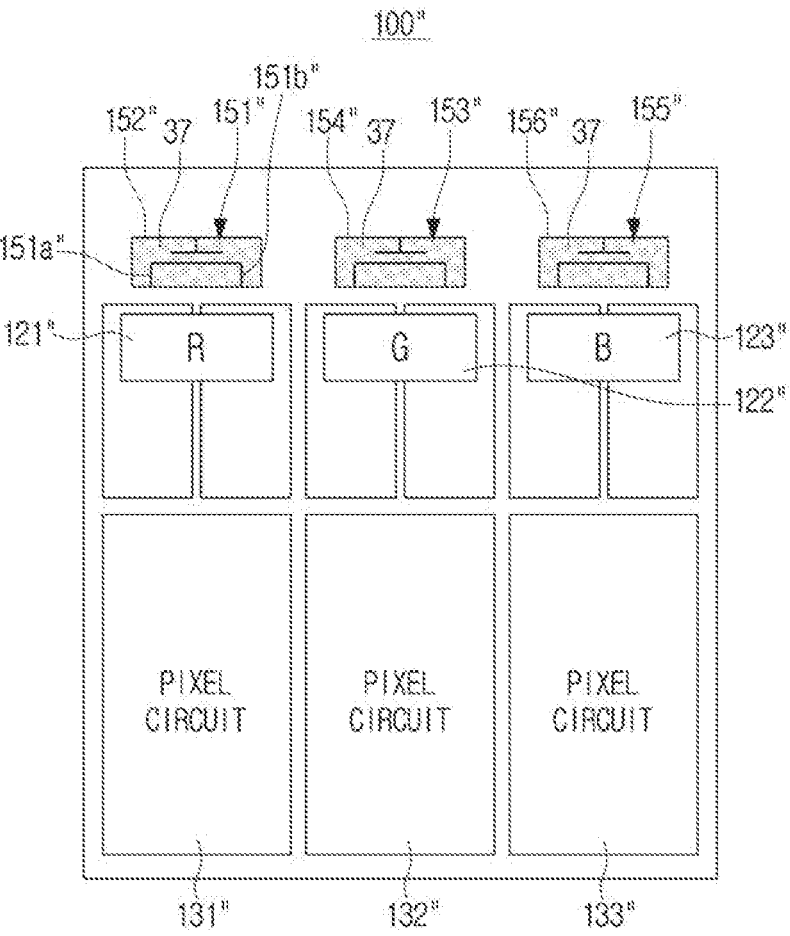
FIG. 9 is a schematic diagram illustrating one from among a plurality of pixel areas formed at a TFT layer of a display module according to an embodiment of the disclosure.
Figure 10:
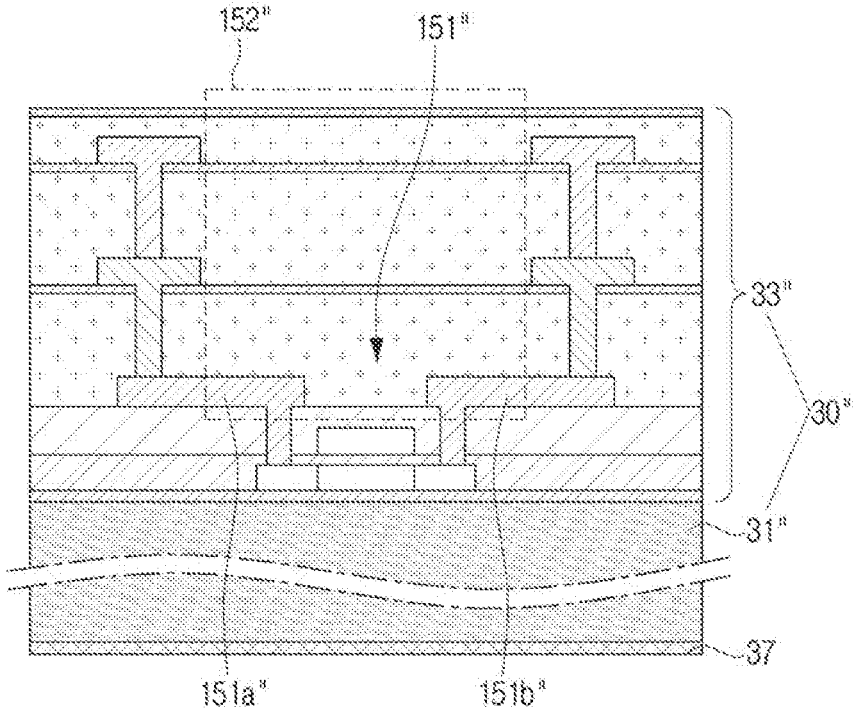
FIG. 10 is a diagram illustrating an example of a sacrificial switching element disposed in the TFT layer shown in FIG. 9 and wirings of the sacrificial switching element being disposed at a cutting area according to an example embodiment.
Figure 11:
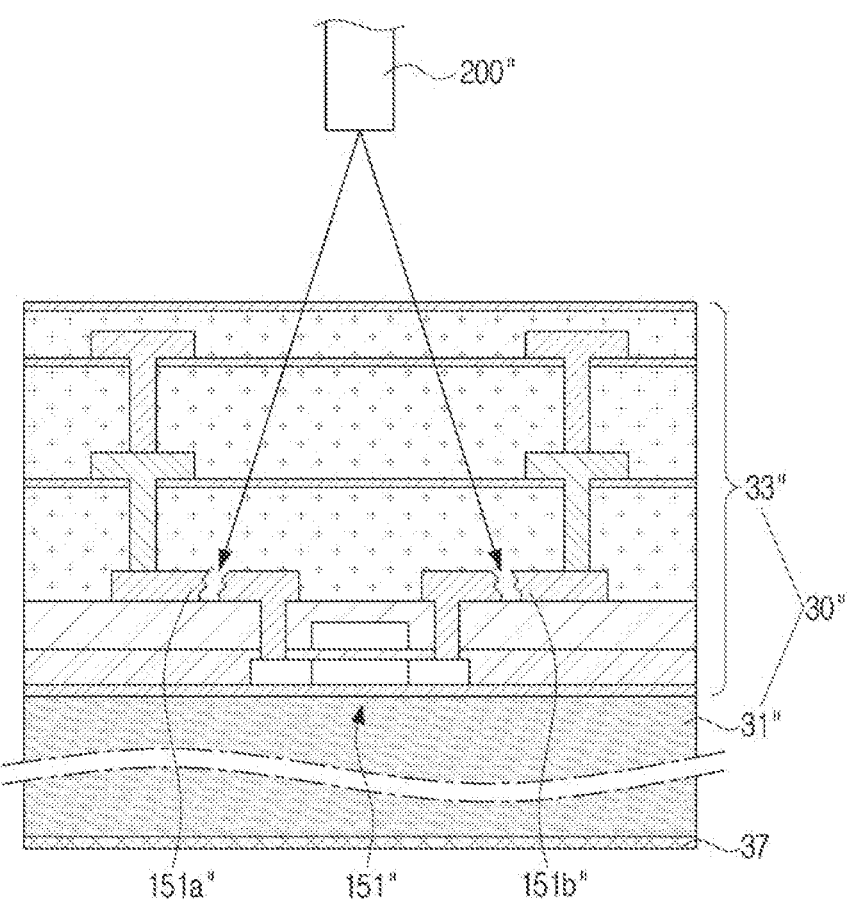
FIG. 11 is a diagram illustrating an example of laser cutting wirings of a sacrificial switching element which is positioned at the cutting area shown in FIG. 10 according to an example embodiment.

FIG. 9 is a schematic diagram illustrating one from among a plurality of pixel areas formed at a TFT layer of a display module according to an embodiment of the disclosure. FIG. 10 is a diagram illustrating an example of a sacrificial switching element disposed in the TFT layer shown in FIG. 9 and wirings of the sacrificial switching element being disposed at a cutting area according to an example embodiment. FIG. 11 is a diagram illustrating an example of laser cutting wirings of a sacrificial switching element which is positioned at the cutting area shown in FIG. 10 according to an example embodiment.

Referring to FIG. 9 and FIG. 10, a metal layer 37 may be formed at a portion corresponding to a pixel area 100" based on a condition required by the display module. Specifically, the metal layer 37 may be formed at a rear surface of a glass substrate 31" which corresponds to a cutting area 152". The metal layer 37 may be an opaque metal wiring for transferring power or a signal.

In this case, the cutting area 152" may be positioned only at a front of a TFT substrate 30". That is, the cutting area 152" may include a pathway from a front surface of a TFT layer 33" to wirings 151a" and 151b" of a sacrificial switching element 151". Through the pathway, the laser beam may reach from the front surface of the TFT layer 33" to the wirings 151a" and 151b" of the sacrificial switching element 151".

Referring to FIG. 11, a laser beam may be emitted toward the front surface of the TFT substrate 30" with respect to the cutting area 152" to cut the wirings 151a" and 151b" of a damaged sacrificial switching element. The laser beam emitted from a laser emitter 200" may reach the wirings 151a" and 151b" of the sacrificial switching element by passing a front surface and a TFT layer 33" with respect to the cutting area 152".

The wirings 151a" and 151b" of the sacrificial switching element may be electrically separated from a sub pixel 121" according to being physically cut by the laser beam.

In FIG. 9, 122" and 123" represent sub pixels, 131", 132", and 133" represent pixel circuits, 153" and 155" represent sacrificial switching elements, and 154" and 156" represent cutting areas.

Even if static electricity is not generated or is generated while manufacturing the display module, the sacrificial switching element disposed far from a position at which static electricity is generated may not be damaged. In this case, because the sub pixel which is transferred to the TFT substrate may be normally controlled by the corresponding pixel circuit, there is no need to cut the wirings of the sacrificial switching element connected to the sub pixel in parallel.

In addition, the plurality of sacrificial switching elements may perform an additional role (e.g., checking whether there is abnormal pixel circuits, discharging remaining current in sub pixels) in addition to a role of absorbing static electricity. That is, the plurality of sacrificial switching elements may be configured such that sub pixels are transferred to the TFT substrate and turned-on according to a control signal for checking whether there are abnormal pixel circuits prior to being electrically connected with the pixel circuit, and that sub pixels are transferred to the TFT substrate and turned-on according to a control signal for discharging electrical charge which remain in the sub pixels after being electrically connected with the pixel circuit.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A display module comprising:
   a thin film transistor (TFT) substrate comprising a glass substrate, a TFT layer provided on the glass substrate, and a plurality of TFT electrodes provided on the TFT layer; and a plurality of light-emitting diodes (LEDs) electrically connected to the plurality of TFT electrodes, wherein the TFT layer comprises a plurality of sacrificial switching elements connected to the plurality of LEDs in parallel, wherein a sacrificial switching element of the plurality of sacrificial switching elements comprises a first wiring electrically connected to an anode of a corresponding pixel circuit, and a second wiring electrically connected to a cathode of the corresponding pixel circuit, the first wiring and the second wiring being positioned in a cutting area, wherein the cutting area comprises a pathway extending from a rear surface of the TFT substrate to the first wiring and the second wiring, wherein the cutting area has a transparency such that a laser beam passes through the cutting area, wherein the TFT layer further comprises a first metal layer extending over both the first wiring and the second wiring, and wherein a distance between the sacrificial switching element and a TFT electrode of the plurality of TFT electrodes corresponding to the sacrificial switching element is shorter than a distance between the corresponding pixel circuit and a TFT electrode of the plurality of TFT electrodes which controls an LED of the plurality of LEDs corresponding to the sacrificial switching element.

2. The display module of claim 1, wherein the first metal layer is provided between a front surface of the TFT layer and the sacrificial switching element.

3. The display module of claim 1, wherein the cutting area comprises a pathway extending from a front surface of the TFT substrate to the first wiring and the second wiring.

4. The display module of claim 3, wherein the cutting area has a transparency such that the laser beam passes through the cutting area, and wherein the glass substrate further comprises a second metal layer provided at a position which corresponds to the cutting area.

5. The display module of claim 4, wherein the second metal layer is provided at a rear surface of the glass substrate.

6. The display module of claim 1, wherein a pair of TFT electrodes to which the LED of the plurality of LEDs corresponding to the sacrificial switching element is connected is provided between the sacrificial switching element and the corresponding pixel circuit.

7. The display module of claim 6, further comprising a protection film comprising an insulating material, wherein a first portion of the pair of TFT electrodes adjacent to the LED corresponding to the sacrificial switching element is not covered by the protection film, and a second portion of the pair of TFT electrodes adjacent to the sacrificial switching element is covered by the protection film.

8. The display module of claim 7, wherein the second portion of the pair of TFT electrodes is an area at which an LED for repair is provided.

9. The display module of claim 1, wherein the plurality of sacrificial switching elements is provided in the TFT layer.

10. A display module comprising:

a thin film transistor (TFT) substrate comprising a glass substrate, a TFT layer provided on the glass substrate, and a plurality of TFT electrodes provided on the TFT layer; and a plurality of light-emitting diodes (LEDs) electrically connected to the plurality of TFT electrodes, wherein the TFT layer comprises a plurality of sacrificial switching elements connected to the plurality of LEDs in parallel, wherein a sacrificial switching element of the plurality of sacrificial switching elements comprises a first wiring electrically connected to an anode of a corresponding pixel circuit, and a second wiring electrically connected to a cathode of the corresponding pixel circuit, and wherein a distance between the sacrificial switching element and a TFT electrode of the plurality of TFT electrodes corresponding to the sacrificial switching element is shorter than a distance between the corresponding pixel circuit and a TFT electrode of the plurality of TFT electrodes which controls an LED of the plurality of LEDs corresponding to the sacrificial switching element.

* * * * *